United States Patent [19]
Dieny et al.

[11] Patent Number: 5,159,513
[45] Date of Patent: Oct. 27, 1992

[54] MAGNETORESISTIVE SENSOR BASED ON THE SPIN VALVE EFFECT

[75] Inventors: Bernard Dieny, San Jose; Bruce A. Gurney, Santa Clara; Serhat Metin, San Francisco; Stuart S. P. Parkin; Virgil S. Speriosu, both of San Jose, all of Calif.

[73] Assignee: International Business Machines Corporation, Armonk, N.Y.

[21] Appl. No.: 652,852

[22] Filed: Feb. 8, 1991

[51] Int. Cl.$^5$ .......................................... G11B 5/127
[52] U.S. Cl. .................................... 360/113; 324/252
[58] Field of Search ................ 360/113, 126; 324/252

[56] References Cited

U.S. PATENT DOCUMENTS 4,103,315 7/1978 Hempstead ..................... 360/113 X
4,949,039 8/1990 Grunberg ........................... 324/252

OTHER PUBLICATIONS

"Thin Film Magnetoresistors in Memory, Storage, and Related Applications", D. Thompson, et al., IEEE Transactions on Magnetics, vol. Mag-11, Jul. 1975.

Primary Examiner—A. J. Heinz
Attorney, Agent, or Firm—Otto Schmid, Jr.; Leslie G. Murray

[57] ABSTRACT

A magnetoresistive (MR) sensor comprising a layered structure formed on a substrate includes a first and a second thin film layer of magnetic material separated by a thin film layer of non-magnetic metallic material such as Cu, Au, or Ag, with at least one of the layers of ferromagnetic material formed of either cobalt or a cobalt alloy. The magnetization direction of the first ferromagnetic layer, at zero applied field, is set substantially perpendicular to the magnetization direction of the second ferromagnetic layer which is fixed in position. A current flow is produced through the sensor, and the variations in voltage across the MR sensor are sensed due to the changes in resistance produced by rotation of the magnetization in the front layer of ferromagnetic material as a function of the magnetic field being sensed.

20 Claims, 5 Drawing Sheets

MAGNETORESISTIVE SENSOR BASED ON THE SPIN VALVE EFFECT

BACKGROUND OF THE INVENTION

1. Field of the Invention

This invention relates in general to magnetic transducers for reading information signals from a magnetic medium and, in particular, to an improved magnetoresistive read transducer.

2. Description of the Prior Art

The prior art discloses a magnetic transducer referred to as a magnetoresistive (MR) sensor or head which has been shown to be capable of reading data from a magnetic surface at great linear densities. An MR sensor detects magnetic field signals through the resistance changes of a read element made from a magnetic material as a function of the amount and direction of magnetic flux being sensed by the element. These prior art MR sensors operate on the basis of the anisotropic magnetoresistive (AMR) effect in which a component of the resistance varies as the square of the cosine ($\cos^2$) of the angle between the magnetization and the direction of current flow. A more detailed description of the AMR effect can be found in the publication, "Thin Film Magnetoresistors in Memory, Storage, and Related Applications", D.A. Thompson et al., IEEE Trans. Mag. MAG-11, p. 1039, (1975). These MR sensors have operated on the basis of the AMR effect even though this effect produces only a very small percentage change in the resistance.

German patent DE3820475 to Grunberg describes a layered magnetic structure which yields enhanced MR effects caused by antiparallel alignment of the magnetization. As possible materials for use in the layered structure, Grunberg lists ferromagnetic transition metals and alloys, but does not indicate which materials from the list are preferred because of superior MR amplitude.

Recently, another MR sensor has been identified in which the resistance between two uncoupled ferromagnetic layers is observed to vary as the cosine of the angle between the magnetizations of the two layers and is independent of the direction of current flow. This mechanism produces a magnetoresistance that, for selected combinations of materials, is greater in magnitude than the AMR, and is referred to as the "spin valve" (SV) magnetoresistance. An SV magnetoresistive sensor is being claimed in pending U.S. application Ser. No. 07/625343, filed Dec. 11, 1990.

The prior art does not disclose an MR sensor which has a large MR response at small applied magnetic fields.

SUMMARY OF THE INVENTION

It is therefore the principal object of this invention to produce a magnetoresistive (MR) sensor which has a large MR response at small applied magnetic fields.

In accordance with the invention, an MR sensor comprising a layered structure formed on a substrate includes first and second thin film layers of ferromagnetic material separated by a thin film layer of non-magnetic metallic material, with at least one of the layers of ferromagnetic material formed of a material taken from the group consisting of cobalt and cobalt alloys. The magnetization direction of the first layer of ferromagnetic material is substantially perpendicular to the magnetization direction of the second layer of ferromagnetic material at zero applied magnetic field. A current flow is produced through the MR sensor, and the variations are sensed in the resistivity of the MR sensor due to the difference in rotation of the magnetizations in the layers of ferromagnetic material as a function of the magnetic field being sensed.

The foregoing and other objects, features and advantages of the invention will be apparent from the following more particular description of a preferred embodiment of the invention as illustrated in accompanying drawings.

DESCRIPTION OF THE PREFERRED EMBODIMENT

Prior art magnetoresistive (MR) sensors have been based on the anisotropic magnetoresistance (AMR) in which a component of the resistance varies as $\cos^2$ of the angle between the magnetization and the direction of current flow.

The recently identified MR sensor described in the 07/625,343 pending application is one in which the resistance between two uncoupled ferromagnetic layers is observed to vary as the cosine of the angle between the magnetizations of the two layers and is independent of the direction of current flow. This mechanism produces a magnetoresistance that for selected combinations of materials, is greater in magnitude than the AMR, and is termed this the "spin valve" (SV) magnetoresistance.

According to the present invention, specific materials systems are disclosed in which the SV magnetoresistance in low fields is larger than any other known systems, whether in multilayer form or not.

Figure 1:
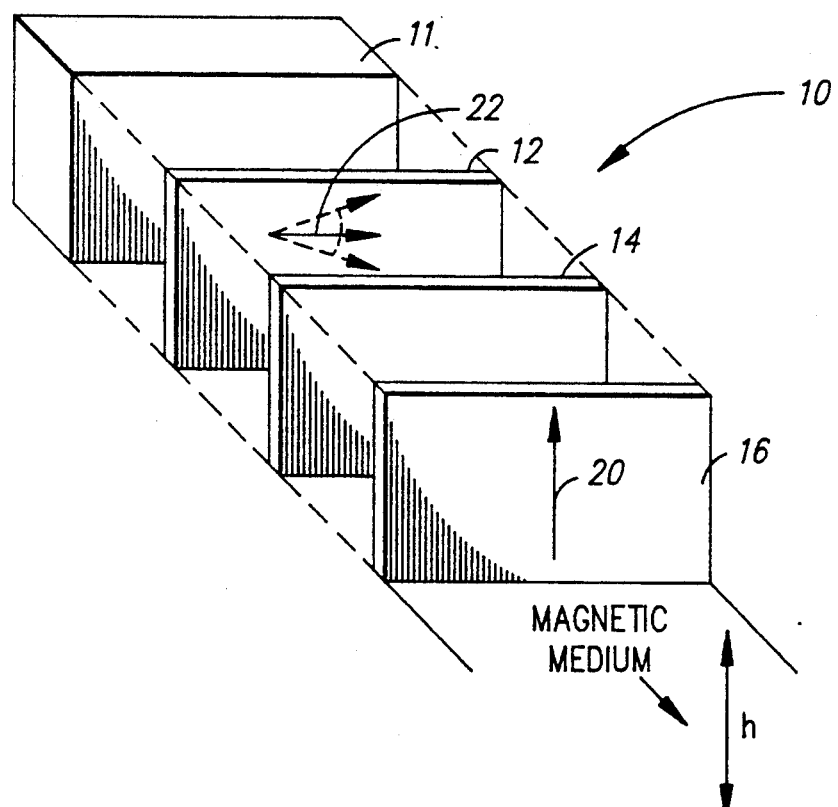
FIG. 1 is an exploded perspective view of a specific embodiment of the magnetoresistive sensor according to the present invention.

The MR SV sensor, according to the present invention, is shown in FIG. 1. The MR sensor 10 comprises a suitable substrate 11 such as glass, ceramic or a semiconductor, for example, upon which is deposited a first thin film layer of soft ferromagnetic material 12, a thin film layer of a nonmagnetic metallic material 14, and a second thin film layer of ferromagnetic material 16. The two layers 12, 16 of ferromagnetic material are oriented with their magnetization at an angle of about 90 degrees with respect to each other in the absence of an applied magnetic field. In addition, the magnetization of the second layer of ferromagnetic material 16 is fixed in position as shown by the arrow 20. The magnetization in the first layer of ferromagnetic material 12, in the absence of an applied magnetic field, is shown by the arrow 22. Changes in magnetization in layer 12 are by rotation, in response to an applied magnetic field, (such as magnetic field h in FIG. 1) as shown by dotted lines on layer 12 in FIG. 1.

In the embodiment of the invention shown in FIG. 1 the second layer of ferromagnetic material 16 is of a higher coercivity than that of the first layer of ferromagnetic layer 12 so that the magnetization of the layer 16 can be fixed in position. The specific embodiment shown in FIG. 2 provides two alternate ways to fix the magnetization of the second layer of ferromagnetic material 16 in position.

Figure 2:
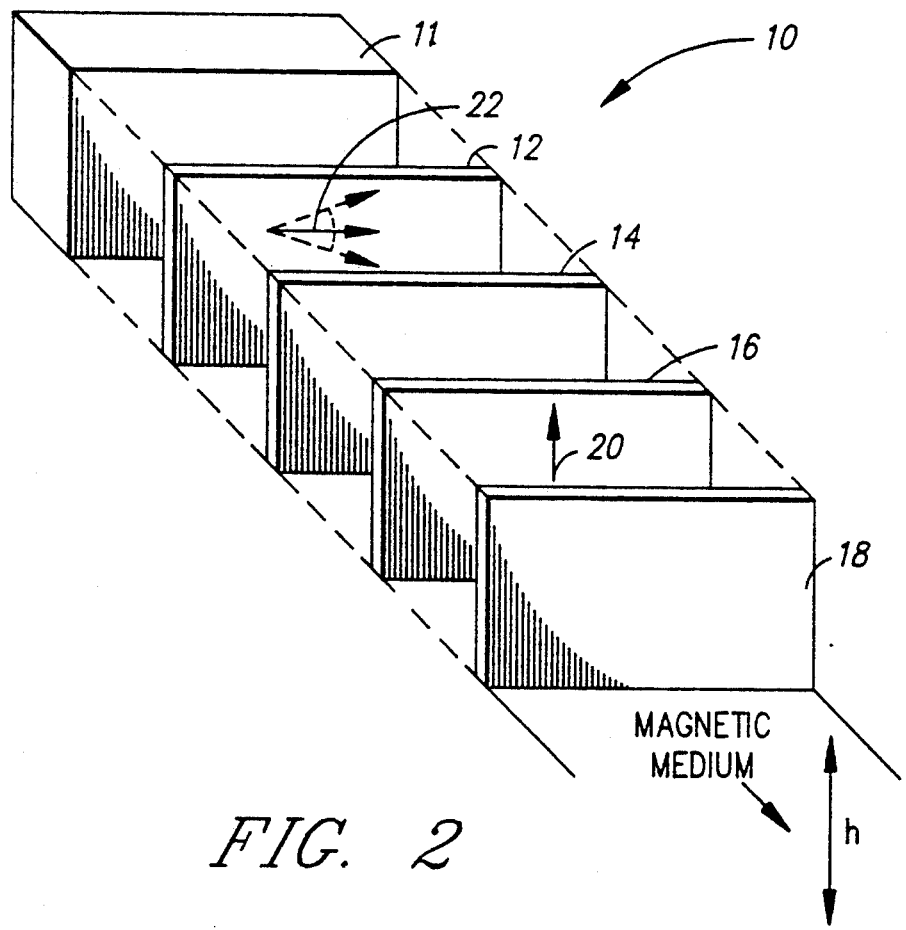
FIG. 2 is an exploded perspective view of an alternate embodiment of the magnetoresistive sensor according to the present invention.

In the embodiment shown in FIG. 2, a thin film layer of an exchange biasing material 18 of high resistance is deposited in direct contact with the second thin film layer of ferromagnetic material 16 so that a biasing field can be produced by exchange coupling as is known in the art. Layer 18 can be an antiferromagnetic material or, alternatively can be a ferromagnetic layer of sufficiently high squareness, high coercivity and high resistance. The structure of FIG. 2 may be inverted, so that layer 18 is deposited first, followed by layer 16, 14, and 12.

According to the preferred embodiment of the present invention, one or both of the ferromagnetic layers 12, 16 is/are either cobalt (Co) or a cobalt alloy. The non-magnetic spacer layer 14 may be copper (Cu) or other noble metal such as silver (AG) and gold (Au). The fixed Co or Co alloy ferromagnetic layer 16 can be exchange biased by FeMn, for example and the magnitude of the exchange bias can be controlled by the use of an underlayer as will be discussed in detail below.

A specific embodiment of the MR SV sensor, according to the present invention, was built on a glass substrate comprising the following structure: glass ¦60Å Co¦32Å Cu¦34Å Co¦100Å FeMn¦10Å Cu. The upper copper layer (not shown in FIG. 2) is deposited in order to retard the oxidation of the FeMn layer. A different, high resistivity passivation layer, such as Ta, for example, would be used in an actual device. The moment vs magnetic field for this structure is shown in FIG. 3(a) which shows the superposition of two loops corresponding to the two Co layers, one of which is exchange biased by the FeMn layer. FIG. 3(b) shows an 8.7% increase in resistivity for the field range from 20 to 120 Oersted (Oe) corresponding to antiparallel alignment of the Co magnetizations. This amplitude is larger than any reported room temperature bulk or thin film magnetoresistance in fields below 80 Oe.

Figure 3:
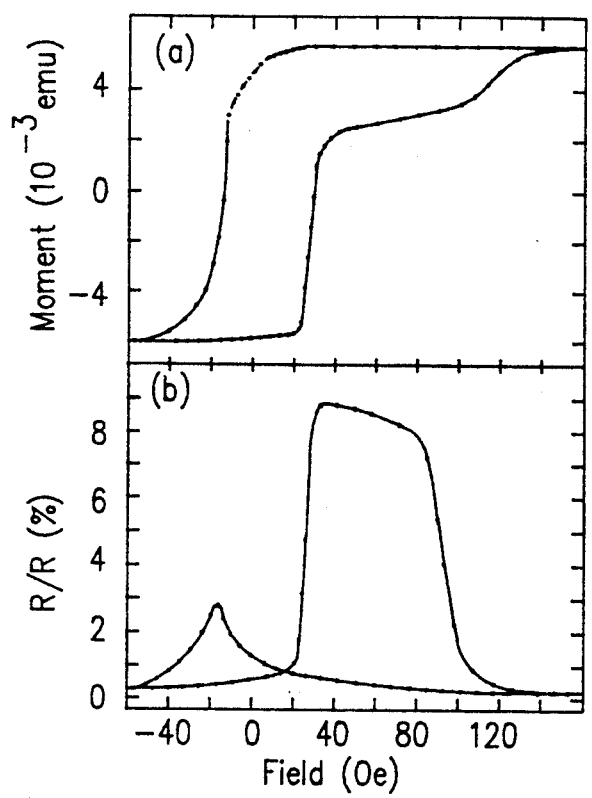
FIG. 3 shows two related graphs, of which (a) is a graph of the room temperature hysteresis loop, and (b) is a graph of the room temperature magnetoresistance of a specific embodiment of the magnetoresistive sensor of FIG. 2.
Figure 4:
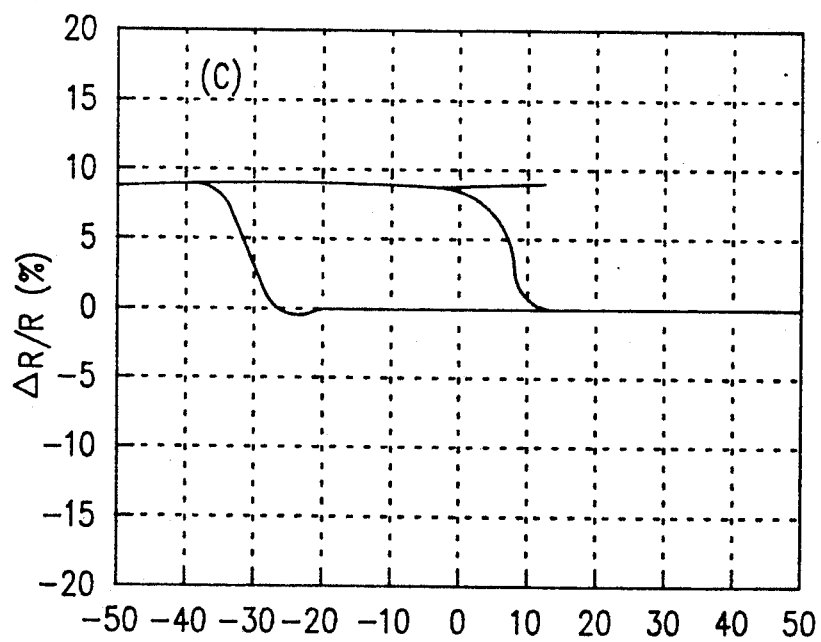
FIG. 4 is a graph which shows the magnetoresistance response along the easy axis of the magnetoresistive sensor of FIG. 3, but on a greatly reduced X-axis scale.

FIG. 4 shows the MR response for the same structure whose magnetic characteristics were shown in FIG. 3. Note that, due to the orientation, by 180°, of the sample, the positive field in FIG. 4 corresponds to the negative field in FIG. 3. In addition, when the field sweep amplitude is too small to reverse the exchange-biased layer 16 (FIG. 2), the antiparallel alignment occurs at fields between −80 and 15 Oe.

The choice of specific materials influences the MR response that can be obtained from the MR SV sensor. For the first ferromagnetic layer 12, soft magnetic properties are required. In addition to pure cobalt, the layer 12 may comprise NiFe, NiCo or a cobalt alloy such as CoZr, CoMoNb, or NiFeCo, for example. The second ferromagnetic layer 16 preferably has hard magnetic properties in order to fix its magnetization in position. In addition to pure cobalt, cobalt alloys such as $Co_{80}Ni_{20}$ can also be used. The second ferromagnetic layer 16 can also have its magnetization fixed in position by exchange coupling to FeMn or NiMn, for example. In another embodiment, the magnetization of layer 16 is fixed by exchange coupling to a high coercivity material such as CoPt or CoPtCr.

Figure 5:
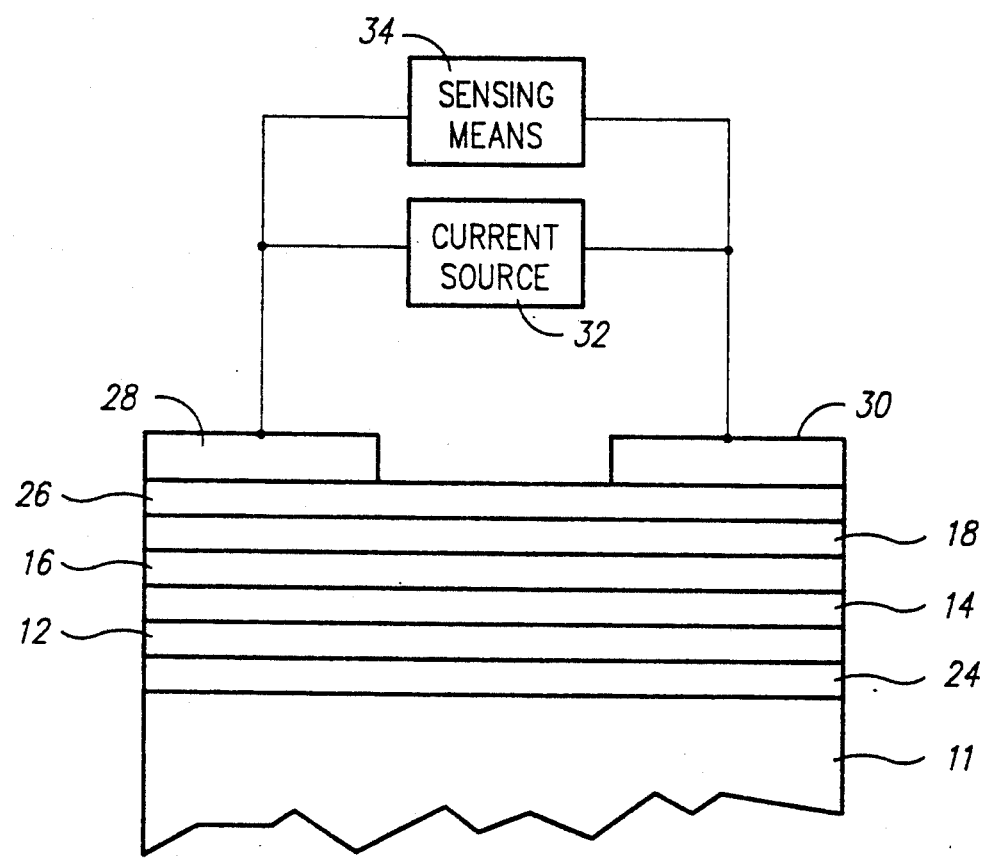
FIG. 5 is an end view of a further embodiment of the magnetoresistive sensor of the present invention.
Figure 6:
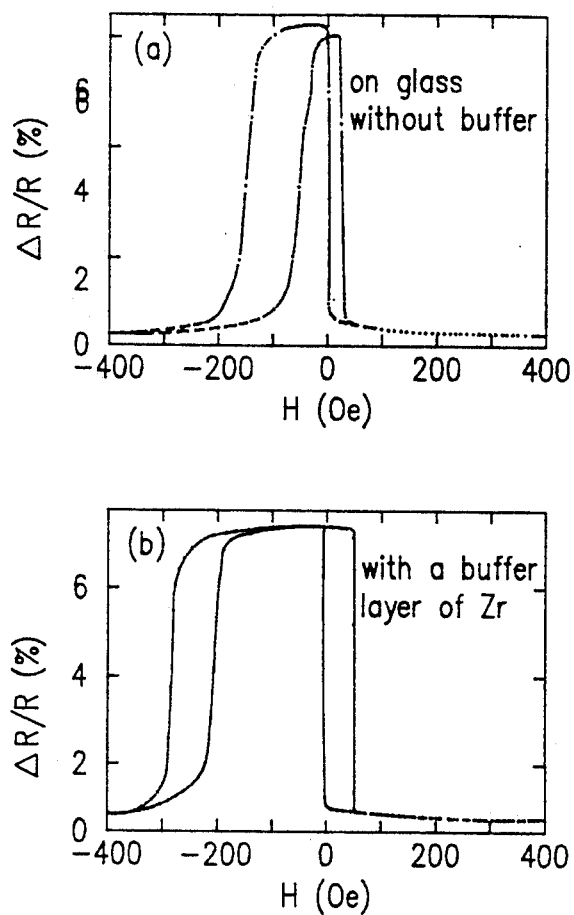
FIG. 6 shows two related graphs, of which (a) is a graph which shows the MR response for a specific embodiment of a magnetoresist sensor according to the present invention, and (b) shows the MR response of a similar structure which includes an underlayer between the substrate and the first ferromagnetic layer.

The level of exchange bias obtainable in the above-described embodiments may not be suitable for some applications. It has been discovered that the level of exchange bias can be increased by the specific embodiment of an MR SV sensor shown in FIG. 5. In this embodiment the substrate 11, the layer of nonmagnetic material 14, the two layers 12, 16 of ferromagnetic material, and the layer of exchange biasing material 18 correspond to the same structure as that described in conjunction with FIGS. 1 and 2. However, a thin underlayer 24 is deposited upon substrate 11 prior to the deposition of the other layers. The underlayer 24 is preferably zirconium (Zr) about 50 Å thick, and this underlayer serves to increase the c-axis texture of the Co layers, resulting in better crystallographic matching between Co and FeMn which in turn increases the exchange coupling. The MR response for a specific example of an underlayer is shown in FIG. 6 in which FIG. 6(a) shows that MR response for a structure without an underlayer, and FIG. 6(b) shows MR response for the same structure, except that 50 Å of Zr was first deposited on the substrate. The structure of FIG. 6(b) comprises: glass ¦50Å Zr.¦72Å Co¦30Å Cu¦32Å Co¦100-Å FeMn¦40Å Zr.

The capping layer 26 (FIG. 5) of a high resistivity material such as Ta or Zr, for example, is then deposited over the MR sensor, and electrical leads 28 and 30 are provided to form a circuit path between the MR sensor structure, current source 32 and sensing means 34.

Figure 7:
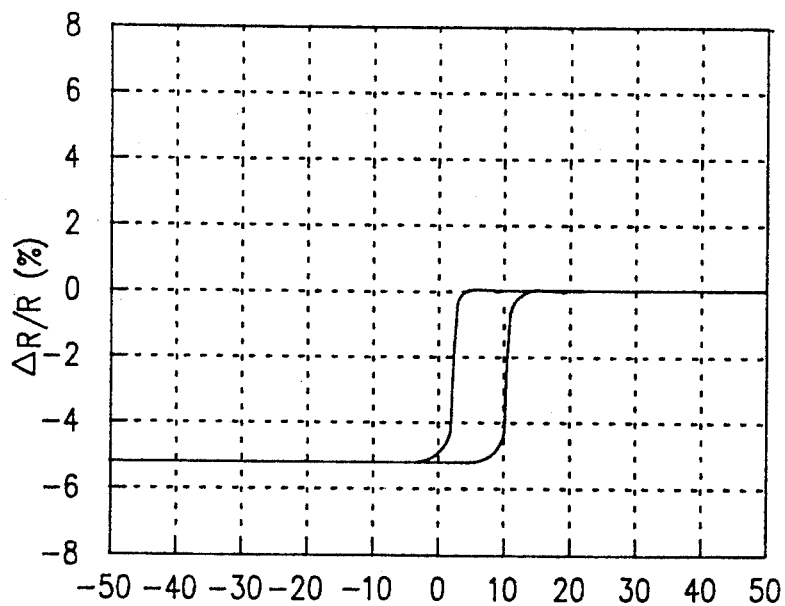
FIG. 7 is a graph which shows the magnetoresistive response of another embodiment of the magnetoresistive sensor of the present invention.

The MR response of a specific embodiment of an MR SV sensor is shown in FIG. 7, and this MR structure combines high MR amplitude (5.2%) with very low saturation fields (150 e). The data shown in FIG. 6 is for an MR sensor which comprises the following structure: Si¦80Å NiFe¦22Å Cu¦35Å Co¦100Å FeMn¦10Å Cu. The MR response can be made even higher by the use of an underlayer (Zr or Ta, for example), and/or a different capping layer (again Zr or Ta, for example). These changes in structure would not produce any deterioration in the soft magnetic properties of the sensor.

An MR SV sensor has been described which utilizes cobalt or cobalt alloys for one or both of the ferromagnetic layers. These structures have larger MR amplitude in low fields than any other known.

While the invention has been particularly shown and described with reference to a preferred embodiment thereof, it will be understood by those skilled in the art that various other changes in the form and details may be made therein without departing from the spirit and scope of the invention.

What is claimed:

1. A magnetoresistive sensing system comprising:
a magnetoresistive sensor comprising a substrate and a layered structure formed on said substrate, the layered structure comprising a first and second thin film layer of ferromagnetic material separated by a thin film layer of non-magnetic metallic material, at least one of said layers of ferromagnetic material being formed of a material taken from the group consisting of cobalt and cobalt alloys, the magnetization direction of said first layer of ferromagnetic material being substantially perpendicular to the magnetization direction of said second layer of ferromagnetic material at zero applied magnetic field;

means for producing a current flow through said magnetoresistive sensor; and means for sensing the variations in the resistivity of said magnetoresistive sensor due to the difference in rotation of the magnetizations in said layers of ferromagnetic materials as a function of the magnetic field being sensed.

2. The magnetoresistive sensing system of claim 1 additionally comprising:

means for fixing the magnetization direction of said second layer of ferromagnetic material; and wherein said changes in resistivity are produced as a result of rotation of the magnetization in said first layer of ferromagnetic material.

3. The magnetoresistive sensing system of claim 2 wherein said layer of non-magnetic material is made from a material taken from the group consisting of copper, silver, and gold.

4. The magnetoresistive sensing system of claim 2 wherein said means for fixing the magnetization direction of said second layer of ferromagnetic material comprises providing said second layer of ferromagnetic material with a substantially higher coercivity than the coercivity of said first layer of ferromagnetic material.

5. The magnetoresistive sensing system of claim 2 wherein said means for fixing the magnetization direction of said second layer of ferromagnetic material comprises a thin film layer of an exchange biasing material in direct contact with said second layer of ferromagnetic material.

6. The magnetoresistive sensing system of claim 5 wherein said layer of non-magnetic material is formed from a material taken from the group consisting of copper, silver and gold.

7. The magnetoresistive sensing system of claim 5 additionally comprising an underlayer between said substrate and said first layer of ferromagnetic material.

8. The magnetoresistive sensing system of claim 7 wherein said layer of non-magnetic material is formed from a material taken from the group consisting of copper, silver, and gold.

9. The magnetoresistive sensing system of claim 7 wherein said underlayer is formed of a material taken from the group consisting of tantalum and zirconium.

10. The magnetoresistive sensing system of claim 1 wherein said first ferromagnetic layer is NiFe and said second ferromagnetic layer is cobalt or a cobalt alloy.

11. A magnetoresistive sensor system comprising:
a substrate; and
a layered structure formed on said substrate, said layered structure comprising a first and second thin film layer of ferromagnetic material separated by a thin film layer of non-magnetic metallic material, at least one of said layers of ferromagnetic material being formed of a material taken from the group consisting of cobalt and cobalt alloys, the magnetization direction of said first layer of ferromagnetic material being substantially perpendicular to the magnetization direction of said second layer of ferromagnetic material at zero applied magnetic field.

12. The magnetoresistive sensor of claim 11 additionally comprising:

means for fixing the magnetization direction of said second layer of ferromagnetic material; and wherein said changes in resistivity are produced as a result of rotation of the magnetization in said first layer of ferromagnetic material.

13. The magnetoresistive sensor of claim 12 wherein said layer of non-magnetic material is made from a material taken from the group consisting of copper, silver, and gold.

14. The magnetoresistive sensor system of claim 12 wherein said means for fixing the magnetization direction of said second layer of ferromagnetic material comprises providing said second layer of ferromagnetic material with a substantially higher coercivity than the coercivity of said first layer of ferromagnetic material.

15. The magnetoresistive sensor of claim 12 wherein said means for fixing the magnetization direction of said second layer of ferromagnetic material comprises a thin film layer of an exchange biasing material in direct contact with said second layer of ferromagnetic material.

16. The magnetoresistive sensor of claim 15 wherein said layer of non-magnetic material is formed from a material taken from the group consisting of copper, silver and gold.

17. The magnetoresistive sensing system of claim 15 additionally comprising an underlayer between said substrate and said first layer of ferromagnetic material.

18. The magnetoresistive sensor of claim 17 wherein said layer of non-magnetic material is formed from a material taken from the group consisting of copper, silver, and gold.

19. The magnetoresistive sensor of claim 17 wherein said underlayer is formed of a material taken from the group consisting of tantalum and zirconium.

20. The magnetoresistive sensor of claim 11 wherein said first ferromagnetic layer is NiFe and said second ferromagnetic layer is cobalt or a cobalt alloy.

* * * * *